(12) United States Patent
Park et al.

(10) Patent No.: US 9,415,343 B2
(45) Date of Patent: Aug. 16, 2016

(54) HEAT RESISTANT HYDROGEN SEPARATION MEMBRANE AND METHOD FOR MANUFACTURING SAME

(71) Applicant: Korea Institute of Energy Research, Daejeon (KR)

(72) Inventors: Jong-Soo Park, Daejeon (KR); Kyung-Ran Hwang, Daejeon (KR); Shin-Kun Ryi, Daejeon (KR); Tae-Hwan Kim, Daejeon (KR); Chun-Boo Lee, Daejeon (KR); Sung-Wook Lee, Jeollanamdo (KR)

(73) Assignee: Korea Institute of Energy Research, Daejeon (KR)

( * ) Notice: Subject to any disclaimer, the term of this patent is extended or adjusted under 35 U.S.C. 154(b) by 0 days.

(21) Appl. No.: 14/370,371

(22) PCT Filed: Jan. 2, 2013

(86) PCT No.: PCT/KR2013/000008
§ 371 (c)(1),
(2) Date: Jul. 2, 2014

(87) PCT Pub. No.: WO2013/105752
PCT Pub. Date: Jul. 18, 2013

(65) Prior Publication Data
US 2015/0020686 A1  Jan. 22, 2015

(30) Foreign Application Priority Data

Jan. 10, 2012  (KR) .................. 10-2012-0003066

(51) Int. Cl.
*B01D 53/22* (2006.01)
*B01D 67/00* (2006.01)
(Continued)

(52) U.S. Cl.
CPC .......... *B01D 53/228* (2013.01); *B01D 67/0072* (2013.01); *B01D 69/10* (2013.01);
(Continued)

(58) Field of Classification Search
CPC .. B01D 53/22; B01D 53/228; B01D 67/0072; B01D 69/10; B01D 71/022; B01D 2325/22; C01B 3/503; C01B 3/505; C23C 16/44
USPC .................................. 95/55, 56; 96/4, 10, 11
See application file for complete search history.

(56) References Cited

U.S. PATENT DOCUMENTS 5,716,527 A * 2/1998 Deckman et al. .............. 96/11
2003/0233940 A1* 12/2003 Takatani et al. ............... 95/56
(Continued)

FOREIGN PATENT DOCUMENTS

JP  2008-237945  * 10/2008  ............. B01D 69/10
KR  1006686470000  1/2007
(Continued)

OTHER PUBLICATIONS

English Language Machine Translation of JP 2008-237945. Retrieved from http://translationportal.epo.org on Dec. 11, 2015.*

*Primary Examiner* — Jason M Greene
(74) *Attorney, Agent, or Firm* — Sterne, Kessler, Goldstein & Fox P.L.L.C.

(57) ABSTRACT

The present invention relates to a hydrogen separation membrane which coats granular ceramic onto the surface of a porous metal support and which coats a hydrogen permeation metal thereon so as to inhibit diffusion between the support and a hydrogen separation layer, and to a method for manufacturing same. As a result, the metal support can be modularized with ease, the hydrogen permeation layer can be made thinner to increase the amount of hydrogen permeation, the use of a separation material can be minimized, and the hydrogen separation membrane can have higher competitiveness.

11 Claims, 3 Drawing Sheets

(51) Int. Cl.
  *B01D 69/10* (2006.01)
  *B01D 71/02* (2006.01)
  *C23C 16/44* (2006.01)
  *C01B 3/50* (2006.01)
  *C23C 16/30* (2006.01)

(52) U.S. Cl.
  CPC ............ *B01D 71/022* (2013.01); *C01B 3/503* (2013.01); *C01B 3/505* (2013.01); *C23C 16/30* (2013.01); *C23C 16/44* (2013.01); *B01D 2325/22* (2013.01); *Y02P 30/30* (2015.11)

(56) References Cited

U.S. PATENT DOCUMENTS

2004/0245191 A1* 12/2004 Yagi et al. ............... 210/791
2006/0260466 A1* 11/2006 Tanaka et al. ............. 95/11
2007/0251389 A1* 11/2007 Katsir et al. .............. 96/11
2010/0147762 A1* 6/2010 Zhang et al. .............. 210/490
2011/0042301 A1* 2/2011 Zhang et al. ............ 210/500.21
2013/0224432 A1* 8/2013 Hospach et al. ........... 428/119
2014/0144322 A1* 5/2014 Hwang et al. ............. 96/11

FOREIGN PATENT DOCUMENTS

| KR | 1020090092532 | 9/2009 |
| KR | 1011368530000 | 4/2012 |
| KR | 1011508730000 | 5/2012 |
| KR | 1013367680000 | 11/2013 |

\* cited by examiner

HEAT RESISTANT HYDROGEN SEPARATION MEMBRANE AND METHOD FOR MANUFACTURING SAME

BACKGROUND OF THE INVENTION

1. Technical Field

The present invention relates to a heat resistant hydrogen separation membrane and a method for manufacturing the same, and more specifically, to a hydrogen separation membrane having a configuration in which granular ceramic is coated on a surface of a porous metal support and hydrogen permeable metal is coated thereon to improve durability, and a method for coating the same. The present invention provides a hydrogen separation membrane with improved durability and heat resistance by inhibiting inter-diffusion between the porous metal support and a separation material through the above-described configuration.

2. Background Art

A separation device is necessary to obtain hydrogen from hydrogen mixed gas, and purification of hydrogen is possible by using a variety of separation processes using pressure swing adsorption (PSA), subzero cooling, a separation membrane, or a getter. Since there is an advantage of high energy efficiency by configuring a process using a separation membrane in the hydrogen purification technique, a lot of research is under way in this field.

The separation membrane may be largely divided into a foil-type film or a coating film prepared by coating a surface of a porous support with dense materials.

Because the hydrogen penetration rate is increased in inverse proportion to a thickness of a separation layer, most studies relate to thin film coating on the surface of the porous support. In particular, because separation materials are expensive compared to the support, hydrogen flux may be improved and costs thereof may be reduced by the thin film coating. For this reason, many studies have progressed in the related art (see Korean Patent Application No 10-2009-0121865).

The porous support is classified into ceramic and metal supports. Since the ceramic support is un-reactive with the coated separation layer, stable characteristics may be obtained, while when the coating film is modularized, sealing and bonding properties may be deteriorated. On the other hand, the metal support has benefits in terms of adhesiveness and characteristics for easy modularization, but has a problem in which diffusion between the coating layer for separating hydrogen and the support may occur, and thereby decrease durability.

In order to overcome the above-described shortcomings, there are efforts to inhibit inter-diffusivity by performing sol-gel coating on the surface of the porous support to form a ceramic coating layer thereon, which may be found in the related art (see Lee Kew-Ho, Seung-Eun Nam, Hydrogen separation by Pd alloy composite membranes: introduction of diffusion barrier, J. Membr. Sci., 2001, 192, 177-185, Lee Kew-Ho et al, Study on the variation of morphology and separation behavior of the stainless steel supported membranes at high temperature, J. Membr. Sci., 2003, 220, 137-153).

However, the above-described process has a difficulty in reproducible manufacturing of the support due to a poor adhesive force between the metal support and ceramic materials coated thereon. Therefore, this restriction acts as one of the biggest challenges when manufacturing the separation membrane by using the porous metal support.

As described above, in order to form a coating film on the porous metal support with the potential for easy modularization, inhibition of diffusion between the support and the coating layer, as well as developments for the surface porous enhancing technique are essentially required, but this has still not been completed.

SUMMARY OF THE INVENTION

Technical Problem

Accordingly, it is an object of the present invention to provide a hydrogen separation membrane which includes a column-shaped ceramic coating layer to inhibit inter-diffusion between a porous metal support and a hydrogen separation layer.

A second object of the present invention is to provide a method for manufacturing the hydrogen separation membrane which includes the column-shaped ceramic coating layer to inhibit inter-diffusion between the porous metal support and the hydrogen separation layer.

Technical Solution

In order to accomplish the foregoing objects, according to the present invention, there is provided a hydrogen separation membrane prepared by coating a surface of a porous metal support with ceramic materials to be grown into a column shape, and coating hydrogen permeable materials thereon, thereby inhibiting inter-diffusion between the support and a separation layer to improve durability thereof, and a method for manufacturing the same.

The metal support may be made of stainless steel, inconel, nickel, or hastelloy powders.

The metal support may have a porous property of a surface average air hole of 20 µm or less.

The ceramic material may be grown into a column shape.

The column may be grown by physical vapor deposition (PVD) (evaporation or sputtering process).

The column may have a diameter of 10 to 200 nm.

The column may have a thickness of 0.01 to 3 µm.

The coating body may have a porosity of 5 to 50%.

The sputtering process may use a method which is carried out by growing oxide using an oxide target, coating in an oxidizing atmosphere using a metal target to be grown into an oxide shape, or growing metal alone, then sintering the same in an oxygen atmosphere to be converted into an oxide shape, and reactive sputtering the same by controlling a process gas to form oxide. That is, the sputtering process may be carried out by any method and sequence so long as the surface of the porous support can be coated with oxide in a column shape.

However, a defect-free complete column shape is not necessarily required. Therefore, as illustrated in FIG. 4, a configuration, in which coating columns are present alone or in a shape of several clusters while forming air holes of 5% or more therein, will be sufficient. Conventionally, there is a problem that, if the ceramic materials are coated in a continuous three dimensional or dense shape, occurrence of delamination may not be substantially inhibited during heating/cooling process due to a large difference in thermal expansion coefficient between the metal support and the ceramic. However, as described in the present invention, when the ceramic materials are coated in an independent column shape, since the coating layer contains defects (gaps) which may be moved with heat expansion of the metal support, it is possible to eliminate the phenomenon of delamination.

The defects should be eliminated as long as possible in other fields, or for a metal surface protection layer or a semiconductor circuit configuration. However, in the present invention, since the defects have a role of a shield layer and a function of providing a hydrogen moving passage corresponding to shrinkage or expansion of the support, it is an absolutely necessary configuration requirement.

In order to form the shield layer in a column shape, the forming process may be carried out in various methods such as anodic oxidation, plasma etching using a fluorine containing gas or the like. This process may use a method including: applying oxide to a surface of the support, by using a chemical vapor deposition (CVD) or sol-gel method to form a continuous oxide coating surface thereon; and removing a remaining part while the other part is left in a column shape so as to form air gaps therein. However, such a process needs the steps of pre-coating or preparing a patterned mask, and etching the same. On the other hand, when a column shape is grown by one process using a PVD method as in the present invention, the shield layer may be formed with a simplified process, and therefore a competitive hydrogen separation membrane may be provided.

Advantageous Effects

According to the present invention, it is possible to provide a hydrogen separation membrane including a ceramic layer formed in a column shape between the porous metal support and the hydrogen separation layer, and a method for coating the same. According to the present invention, it is also possible to provide a hydrogen separation membrane with improved durability as well as the potential for easy modularization due to the characteristics of the metal support, and a method for manufacturing the hydrogen separation membrane which facilitates mass production.

The heat resistant separation membrane according to the present invention is a coating film which is fabricated by a simple process and is easily modulated due to the characteristics of the metal support, thereby it, has a price which is competitive enough to be applied to hydrogen manufacturing and purification processes, as well as to a supersized hydrogen separation process such as carbon dioxide capture and storage (CCS). Therefore, economic production of hydrogen may be accomplished, and it is expected to be used as a core material in the field for prevention of global warming.

DETAILED DESCRIPTION OF THE INVENTION

Figure 1:
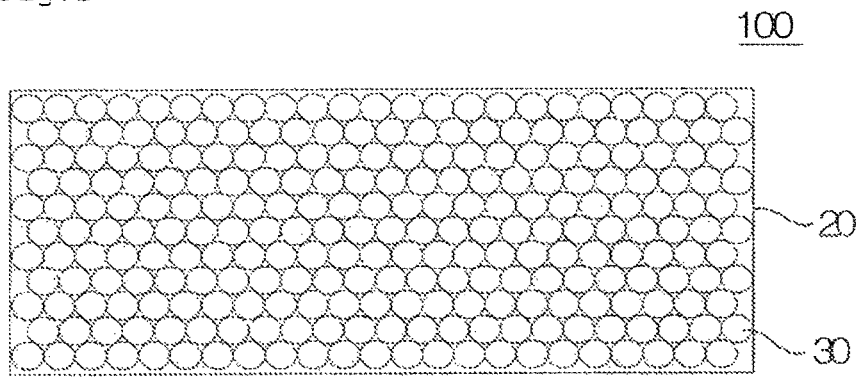
FIG. 1 is a plane view of a base part prepared by applying an interdiffusion barrier on a metal support in the prior art.
Figure 2:
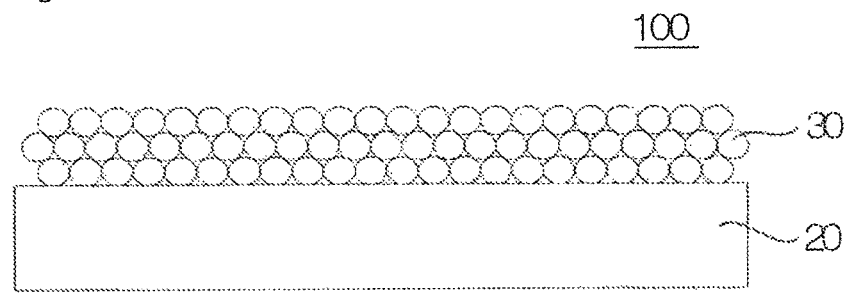
FIG. 2 is a cross-sectional view of the base part prepared by applying the interdiffusion barrier on the metal support in the prior art.
Figure 3:
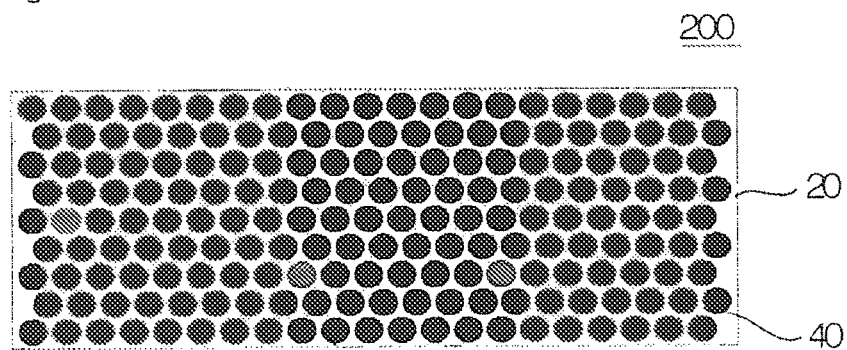
FIG. 3 is a plane view of a base part prepared by applying an interdiffusion barrier on a metal support according to the present invention.
Figure 4:
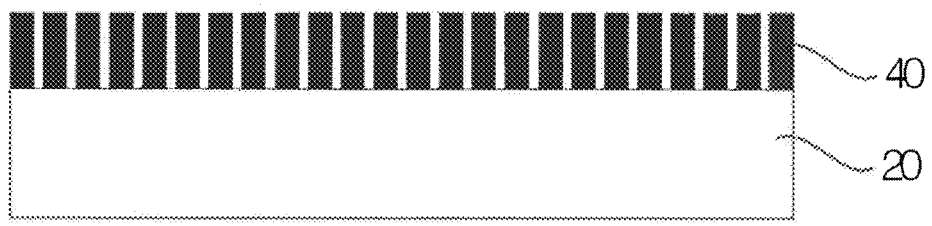
FIG. 4 is a cross-sectional view of the base part prepared by applying the interdiffusion barrier on the metal support according to the present invention.
Figure 5:
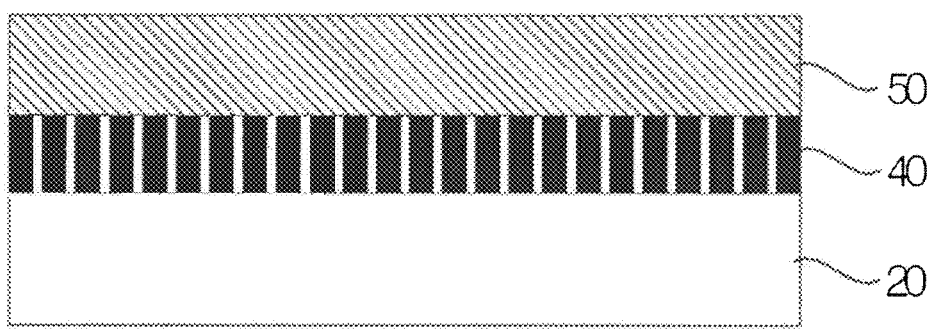
FIG. 5 is a cross-sectional view of a heat resistant hydrogen separation membrane according to the present invention.

Hereinafter, exemplary embodiments of the present invention will be described in detail with reference to the accompanying drawings. Referring to the drawings, wherein like reference characters designate like or corresponding parts throughout the several views. In the embodiments of the present invention, a detailed description of publicly known functions and configurations that are judged to be able to make the purport of the present invention unnecessarily obscure are omitted.

In the present invention, a surface of a porous metal support 20 is coated with ceramics or a mixture of ceramics and metals in a column shape to form an interdiffusion barrier 40, and thereby preparing a base part 200, and a hydrogen separation layer 50 is applied on the interdiffusion barrier 40 to provide a hydrogen separation membrane 300 with improved durability and heat resistance. In addition, the present invention provides a method for manufacturing the hydrogen separation membrane.

The hydrogen separation membrane may be manufactured by coating the surface of the porous metal support with at least one selected from Pd, Cu, Ag, Au, Ni, Gd, Nb, V, Cr, Ru, Pt, and Rh.

Conventionally, when using the hydrogen separation membrane for a long time there is a problem in which the hydrogen penetration rate is reduced by inter-diffusion which occurs between the support and the separation membrane, and the selectivity for hydrogen is decreased due to a loss of the separation layer. In order to solve this problem, studies for fort ling a diffusion inhibition layer between the support and the separation layer have been carried out. That is, coating with ceramics for inhibiting diffusion between the support metal and the separation layer metal is a well-known technology it the related art. However, a process suitable for mass production has not been developed, and thus this technology has not achieved commercialization.

When examining the results of existing studies, there are methods of applying a ceramic coating body 30 on the porous metal support 20 as illustrated in FIG. 1, and these are approached from a direction for coating fine powders using a sol of an oxide source or a binder. However, commercialization by using such a process has not been completed.

The most troublesome part of the above-described process is to coat a metal surface with ceramics, specifically, when coating the flat metal surface with ceramics, which is necessary for completing an ultra-thin separation membrane, it is difficult to secure adhesion there between. In particular, such a problem is further increased when the separation membrane is formed with a large area.

Since cracks of ceramic are generated on the surface coated through the above-described process during a drying or sintering process, a process for inhibiting or removing the cracks should be repeatedly performed several times. Therefore, there is a problem of consuming a lot of production time. In particular, since the crack occurrence frequency and the width of cracks are determined depending on the concentration of sol, thickness of sol coating layer, and drying conditions, it is difficult to secure the reproducibility of the process.

The above-described phenomenon is a natural phenomenon generated due to evaporation of moisture during a drying process. Further, cracks may also be generated due to a difference in thermal expansion between two materials of the ceramic material and the support during the sintering process after coating the shield layer.

In order to overcome the above-described problems, the present inventors consider a method of growing the ceramic coated on the surface of the porous metal support 20 into an independent column shape. Since respective columns can correspond to expansion, and shrinkage of the support during heating and cooling processes, generation of large cracks such as sol coating may be fundamentally inhibited.

Preferably, the column has a diameter in a range of 0.01 to 1 μm. When the column is finely coated in a diameter less than 0.01 μm, heat resistance of the ceramic column may be decreased, and when the column is grown into a diameter exceeding 1 μm, the adhesion may be weakened. Preferably, the column has a thickness in a range of 0.02 to 5 μm. When the column has a thickness less than 0.02 μm, a function of providing a shield layer is weakened, and thereby the function of shielding between the support and the separation layer may be reduced. When the column is grown into a thickness exceeding 5 μm, a lower portion of the column may be dense and adhesion may be weakened.

Figure 6:
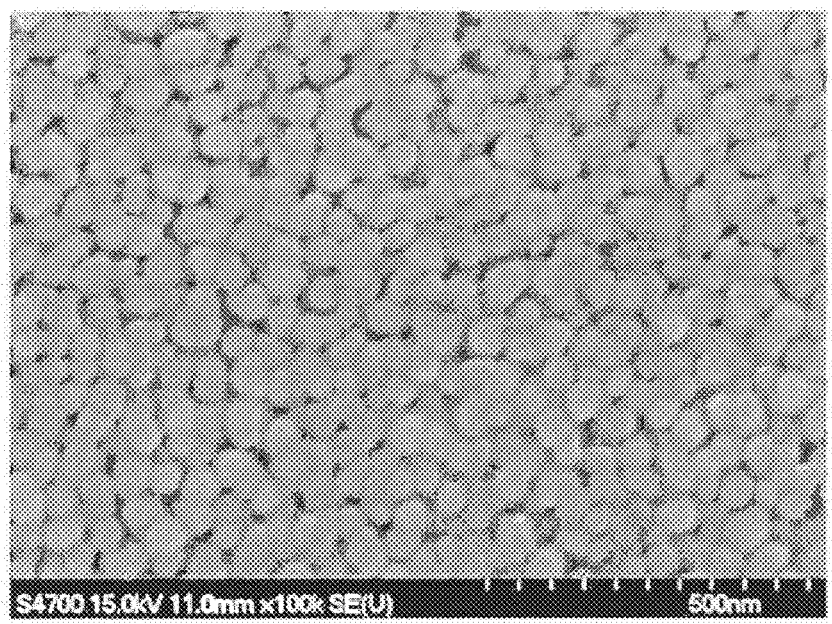
FIG. 6 is a plane view corresponding to a photograph showing a diffusion inhibition layer coated with zirconium oxide according to the present invention.
Figure 7:
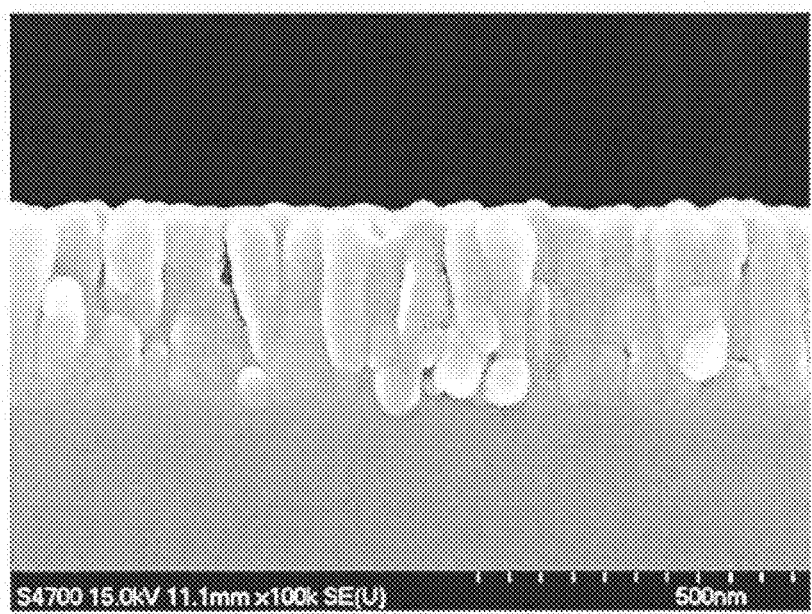
FIG. 7 is a cross-sectional view corresponding to a photograph showing the diffusion inhibition layer coated with zirconium oxide according to the present invention.

As a result of coating with zirconium oxide by using the above-described configuration, an appearance is obtained as illustrated in FIGS. 6 and 7. As seen from the photographs taking the surface of the coating bodies, fine air holes are formed between the columns, and when examining the cross-section state, fine cracks are present in interfaces between the columns. Therefore, it can be seen that the columns are movable with the movement of the support during the thermal expansion. That is, because a difference in thermal expansion coefficient between the ceramic and the metal is a unique characteristic of the materials, it is not possible to overcome the above-described phenomenon. Accordingly, when coating a surface of the metal with ceramics, it is possible to maintain the ceramics in a stable state regardless of expansion or shrinkage of the support by applying the ceramics at a predetermined interval so as to be independently coated. However, when the air holes in the surface of the ceramic coating bodies have a large size exceeding 1 μm, there is a difficulty in densification during coating with the separation materials, and therefore it may be a factor for increasing the thickness of the separation coating layer. Therefore, it is preferable that the air holes in the surface of the ceramic coating layer have an average diameter of 0.05 to 1 μm. More preferably, even when coating the separation layer with an ultra-thin film within a range of 0.1 to 0.5 μm, dense materials may also be formed.

The column may be formed by executing a PVD process using ceramic oxide.

The column may be formed of a mixture of ceramics and metals.

The column may be formed by coating in a reactive PVD process while supplying oxygen using a metal target.

The column may be formed by growing so as to contain a metal composition, and sintering the same in an oxygen atmosphere to be converted into an oxide shape.

The column may be formed by growing so as to contain a metal composition, and treating the same in a plasma condition including oxygen to be converted into an oxide shape.

The ceramic material may include at least one oxide selected from Ti, Zr, Al, Si, Ce, La, Sr, Cr, V, Nb, Ga, Ta, W and Mo. The ceramic material may include at least one nitride selected from Ti, Zr, Al, Si, Ce, La, Sr, Cr, V, Nb, Ga, Ta, W and Mo.

The material forming the hydrocarbon separation layer may include at least one selected from Pd, Cu, Ag, Ni, Au, Ru, Rh, Nb, Ta, V, Cr, Al, Y and Ga.

The material of the hydrocarbon separation layer may be applied by dry coating, wet coating, or any combination thereof without particular limitation thereof.

In an embodiment illustrated in the present invention, the diffusion inhibition layer is coated with zirconium oxide and the hydrocarbon separation layer is coated with Pd, or an Au composition, which are applied by dry sputtering.

Hereinafter, preferred embodiments of the present invention will be described by the following example, however, the example is proposed to more specifically describe the present invention, and the scope of the present invention is not restricted thereto.

Example 1

Step 1 (Oxide Coating)

A circular porous support having a diameter of 50 mm was formed by using fine nickel powders with an average diameter of 2 μm, and heat treatment (at 900° C. for 2 hours) was performed in a hydrocarbon atmosphere to apply strength thereto. Then, wet polishing was performed to adjust the surface roughness thereof to 100 nm or less.

A surface of the porous support was coated with zirconium oxide. The coating was carried out by mounting a $ZrO_2$ target on a sputter while using an AC power source (150 W) for 10 minutes. At this time, in order to observe the cross-section state of the coating layer, coating onto an easy-cut-wafer specimen was also simultaneously carried out.

A vacuum was applied so that the pressure in a coating chamber became stable at $2.0 \times 10^{-6}$ Torr, and then coating was carried out at 20 mTorr. The coating was carried out in a condition in which Ar is supplied into the coating chamber as a process gas at 30 ml/min, and the temperature of a support holder is maintained at 600° C.

Step 2 (Separation Layer Coating)

The surface of the support was sequentially coated with palladium (Pd) and gold (Au) to prepare a separation membrane. Coating was carried out by mounting palladium and gold targets on a sputter while using a DC power source to form a palladium layer in a thickness of 3 μm and a gold layer in a thickness of 60 nm. A vacuum was applied so that the pressure in a coating chamber became stable at $2.0 \times 10^{-6}$ Torr, and then coating was carried out at 20 mTorr. At this time, the coating was carried out in a condition in which the temperature of the support holder is maintained at 600° C.

In order to test heat resistance of the separation membrane, the membrane was sintered in a vacuum atmosphere at 700° C. for 4 hours.

A specimen having a shape in which the coated zirconium oxide is mounted on the silicon wafer was cut to analyze the state of the coating layer. As shown in FIG. 7, it can be seen that the zirconium oxide is coated in a column having a diameter of 50 to 60 nm with some components coated in a particle shape. In addition, as shown in the surface photograph of FIG. 6, it can be confirmed that air holes are well developed in the surface and gaps (spaces) which can correspond to expansion or shrinkage of the support are present when examined in relation to the cross-section thereof.

As a result of analyzing (EDS) the surface composition of the separation membrane, as summarized in Table 1 below, in case of the support having 97 wt. % palladium and 3 wt. % gold, nickel (Ni) is below detectable levels. When comparing with the Comparative Examples to be described below, this phenomenon is caused by inhibiting the diffusion of zirconium oxide into the palladium layer.

TABLE 1

|  | Pd (wt. %) | Au (wt. %) | Ni (wt. %) |
|---|---|---|---|
| Example | 97.0 | 3.0 | — |
| Comparative Example | 78.4 | 1.5 | 20.1 |

The hydrogen permeability of the heat treated coating film was measured. The separation membrane was fastened to the module, after stabilizing at 400° C. for 24 hours, 99.999% hydrocarbon was supplied therein to apply a pressure difference of 1 bar between the upper and lower ends of the separation membrane, and hydrogen and nitrogen permeation rates were measured while changing the temperature of the module to 300° C., 350° C., and 400° C., respectively. As a result of measurement, as summarized in Table 2 below, a maximum hydrogen permeation rate (flux) of 32 ml/cm$^2$·min was obtained. In addition, the nitrogen permeation rate was shown to be at an undetectable level. That is, the selectivity for the hydrogen/nitrogen is close to infinity, and thereby it is possible to know that a dense separation membrane is obtained.

TABLE 2

|  | Temperature (° C.) | Hydrogen flux (ml/cm$^2$·min) | Nitrogen flux (ml/cm$^2$·min) | Hydrogen pressure difference (bar) |
|---|---|---|---|---|
| Example | 300 | 22 | 0.01 or less | 1 |
|  | 350 | 27 |  |  |
|  | 400 | 32 |  |  |
| Comparative Example | 300 | 1 | 0.01 or less | 1 |
|  | 350 | 2 |  |  |
|  | 400 | 4 |  |  |

Comparative Example

A separation membrane was prepared in the same manner as the above-described Example, except that, the surface of the support was sequentially coated with palladium and gold, which are separation materials, without carrying out coating with zirconium oxide.

As a result of analyzing (EDS) the surface composition of the separation membrane, as summarized in Table 1 above, it can be seen that the content of nickel diffused onto the surface of the separation membrane was 20 wt. %. As a result of measuring the hydrogen permeation rate, as illustrated in Table 2, it was shown that the hydrogen flux is in a level of 5 to 20% compared to the separation membrane of Example 1 in which zirconium oxide was coated as a diffusion inhibition layer. It can be seen that the hydrogen permeation rate is reduced by the nickel diffused into the palladium layer based on these results.

Although the present invention has been described in connection with the exemplary embodiments illustrated in the drawings, it is only illustrative. It will be understood by those skilled in the art that various modifications and equivalents can be made to the present invention. Therefore, the true technical scope of the present invention should be defined by the appended claims.

DESCRIPTION OF REFERENCE NUMERALS

20: porous metal support, 30: ceramic coating body
40: interdiffusion barrier, 50: hydrogen separation membrane 100, 200: base part, 300: hydrogen separation membrane

What is claimed is:

1. A hydrogen separation membrane comprising:
    a porous metal support;
    an interdiffusion barrier which is prepared by coating a surface of the porous metal support with a mixture of ceramics and metals in a column shape perpendicular to the surface of the porous metal support; and
    a dense hydrogen separation layer which is applied on the interdiffusion barrier wherein the dense hydrogen separation layer comprises at least one selected from the group consisting of Cu, Ag, Ni, Au, Ru, Rh, Nb, Ta, V, Cr, Al, Y and Ga.

2. The hydrogen separation membrane according to claim 1, wherein the ceramic components include any one of oxide-based, non-oxide-based, and nitride-based components, or a mixture thereof.

3. The hydrogen separation membrane according to claim 1, wherein the interdiffusion barrier includes at least one selected from Al, Ti, Si, Zr, Y, Ce, Ga, Nb, V, Cr, Ru, Pd, Ag, W, and Mo.

4. The hydrogen separation membrane according to claim 1, wherein the interdiffusion barrier in a column shape has a coating thickness of 50 nm to 3 μm, and is coated so that the column has a diameter of 10 nm to 3 μm.

5. The hydrogen separation membrane according to claim 1, wherein the interdiffusion barrier in a column shape has a porosity of 5 to 50%.

6. A method for manufacturing the hydrogen separation membrane according to claim 1, comprising:
    coating a surface of a porous metal support with a mixture of ceramics and metals in a column shape perpendicular to the surface of the porous metal support to form an interdiffusion barrier; and
    applying a dense hydrogen separation layer on the interdiffusion barrier, wherein the dense hydrogen separation layer comprises at least one selected from the group consisting of Cu, Ag, Ni, Au, Ru, Rh, Nb, Ta, V, Cr, Al, Y and Ga.

7. The method according to claim 6, wherein the interdiffusion barrier is formed in a column shape by PVD dry coating.

8. A method for manufacturing the hydrogen separation membrane according to claim 2, comprising:
    coating a surface of a porous metal support with a mixture of ceramics and metals in a column shape perpendicular to the surface of the porous metal support to form an interdiffusion barrier; and
    applying a dense hydrogen separation layer on the interdiffusion barrier, wherein the dense hydrogen separation layer comprises at least one selected from the group consisting of Cu, Ag, Ni, Au, Ru, Rh, Nb, Ta, V, Cr, Al, Y and Ga.

9. A method for manufacturing the hydrogen separation membrane according to claim 3, comprising:
    coating a surface of a porous metal support with a mixture of ceramics and metals in a column shape perpendicular to the surface of the porous metal support to form an interdiffusion barrier; and
    applying a dense hydrogen separation layer on the interdiffusion barrier, wherein the dense hydrogen separation layer comprises at least one selected from the group consisting of Cu, Ag, Ni, Au, Ru, Rh, Nb, Ta, V, Cr, Al, Y and Ga.

10. A method for manufacturing the hydrogen separation membrane according to claim 4, comprising:
    coating a surface of a porous metal support with a mixture of ceramics and metals in a column shape perpendicular to the surface of the porous metal support to form an interdiffusion barrier; and
    applying a dense hydrogen separation layer on the interdiffusion barrier, wherein the dense hydrogen separation layer comprises at least one selected from the group consisting of Cu, Ag, Ni, Au, Ru, Rh, Nb, Ta, V, Cr, Al, Y and Ga.

11. A method for manufacturing the hydrogen separation membrane according to claim 5, comprising:
    coating a surface of a porous metal support with a mixture of ceramics and metals in a column shape perpendicular to the surface of the porous metal support to form an interdiffusion barrier; and
    applying a dense hydrogen separation layer on the interdiffusion barrier, wherein the dense hydrogen separation layer comprises at least one selected from the group consisting of Cu, Ag, Ni, Au, Ru, Rh, Nb, Ta, V, Cr, Al, Y and Ga.

* * * * *